United States Patent [19]

Bouchard

[11] Patent Number: 4,852,174
[45] Date of Patent: Jul. 25, 1989

[54] SYSTEM AND METHOD FOR THE IDENTIFICATION OF PHASE CONDUCTORS

[75] Inventor: Bertrand Bouchard, Laval, Canada

[73] Assignee: Hydro-Quebec, Quebec, Canada

[21] Appl. No.: 37,620

[22] Filed: Apr. 13, 1987

[51] Int. Cl.⁴ .............................................. H04R 29/00
[52] U.S. Cl. ......................................... 381/58; 324/66
[58] Field of Search ................... 324/127, 126, 66, 67; 379/25; 381/58, 1

[56] References Cited

U.S. PATENT DOCUMENTS

| | | | |
|---|---|---|---|
| 3,076,931 | 2/1963 | Jasper | 324/67 |
| 3,891,811 | 6/1975 | Miller | 324/66 |
| 4,095,167 | 6/1978 | Weber | 324/67 |
| 4,112,349 | 9/1978 | Weber | 324/67 |
| 4,513,246 | 4/1985 | Blain | 324/127 |
| 4,524,320 | 6/1985 | Brooks | 324/66 |
| 4,648,113 | 3/1987 | Horn et al. | 381/1 |
| 4,656,418 | 4/1987 | Boston et al. | 324/127 |
| 4,724,381 | 2/1988 | Crimmins | 324/127 |

OTHER PUBLICATIONS

Advertisement for "Dynatel Corporation 500", (Jan., 1974).

*Primary Examiner*—Forester W. Isen
*Attorney, Agent, or Firm*—Oblon, Spivak, McClelland, Maier & Neustadt

[57] ABSTRACT

The present invention provides a system for the identification of the phase of conductors in electrical circuits, at junctions location, regardless if the connectors are connected to ground. The system comprises two independent generators connectable to the phase conductors by electromagnetic coupling, and at any available location along these conductors, and generating different audio signals. An appropriate receiver is provided and connected to the phase conductors, at selected locations for the identification of the different audio signals. The present invention also provides a method for the identification of the phase of conductors in an electrical circuit, even when the conductors are connected to ground above the selected location for effecting the identification. The method consists in connecting, by electromagnetic coupling, two independent generators generating different audio signals, in pre-identified phase conductors. At a selected location for the identification of the phase of the conductors, an appropriate receiver is connected to phase conductors and tested two by two to identify their proper phases.

29 Claims, 3 Drawing Sheets

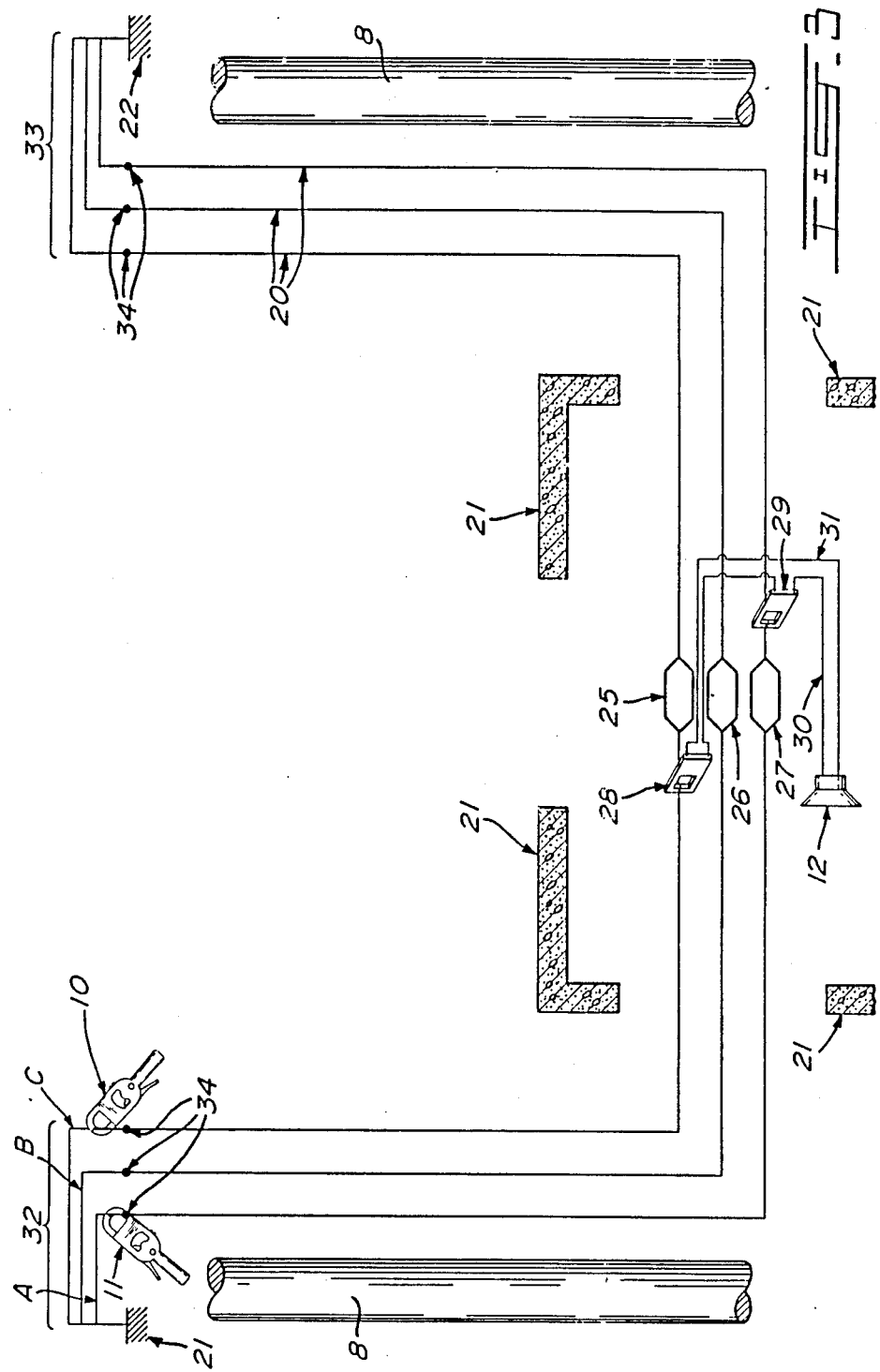

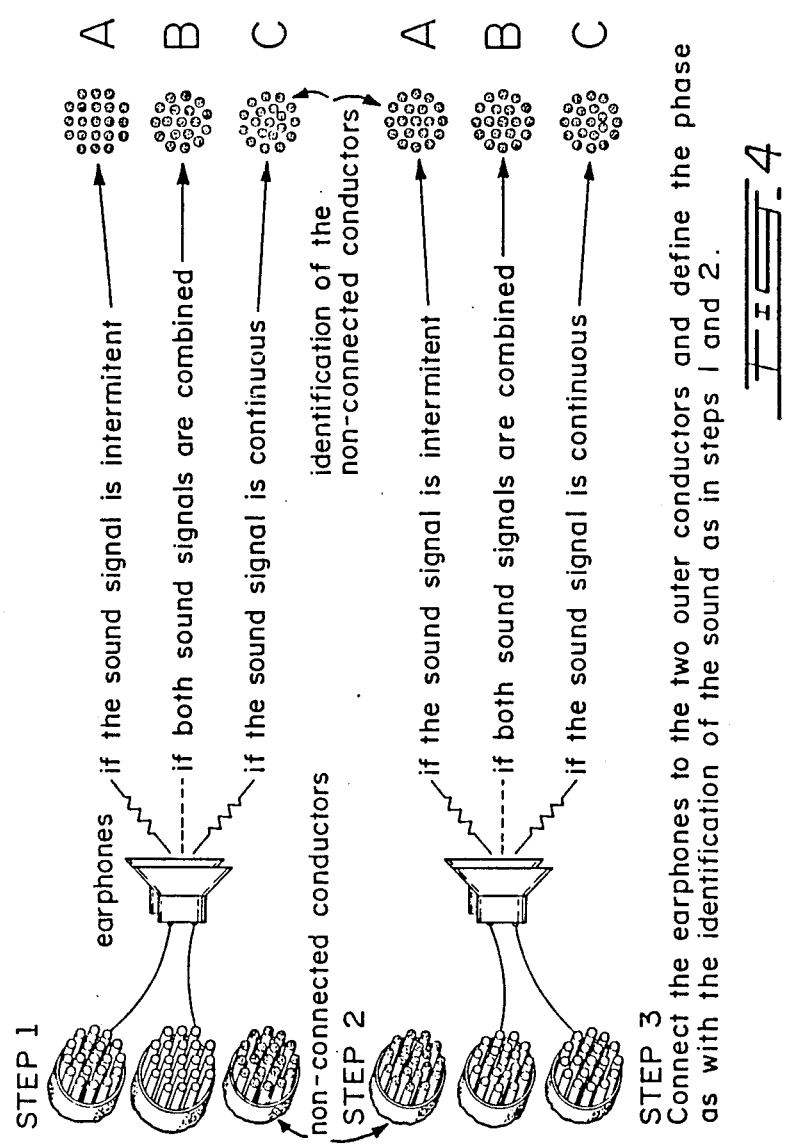

SYSTEM AND METHOD FOR THE IDENTIFICATION OF PHASE CONDUCTORS

BACKGROUND OF THE INVENTION (a) Field of the invention

The present invention relates to a system and a method for the identification of the phase of conductors in an electrical circuit electrically interconnection, regardless if the conductors are connected to ground above the location selected for the identification, by using two independent generators generating different audio signals and connected to the phase conductors by electromagnetic coupling at an available location along the conductors, and an appropriate receiver connected to the phase conductors at a selected location for the reception of the signals and identification of the phase of the conductors identification.

(b) Description of Prior Art

Until now, phase conductors identifying devices, such as resistant boxes, diodes, audio or pulse signal generators, are directly connected to phase conductors to be identified and cannot work when the conductors are connected to ground above the location selected to effect the identification. This requires the removal of the ground connections during the identification period, thus making it very hazardous for the users.

SUMMARY OF THE INVENTION

One of the features of the present invention consists in the provision of a system and of a method for the identification of the phase of conductors in electrical circuits, whether they are or not connected to ground above the location selected for the identification.

Another feature of the present invention consists in the provision of a system for the identification of phase conductors which comprises two independent generators generating different audio signals which are transmitted to phase conductors and connected thereto by electromagnetic coupling.

Another feature of the present invention consists in the provision of a system for the identification of phase conductors in electrical circuits in which two independent generators generating different audio signals are electromagnetically connected to phase conductors, at any available location along the cable.

Another feature of the present invention consists in the provision audio signal generators having rechargeable batteries and having the shape of amperemeter clamps.

Another feature of the present invention consists in the identification of the phase of conductors of an electrical circuit, at a location selected for the identification, by the use of appropriate receivers means i.e. earphones, amplifiers loudspeakers, for receiving different audio signals emitted by two independent generators, electromagnetically clamped to the conductors. The receiver means is connected to two of the conductors to be identified either directly, if the phase conductors are not insulated, or by electromagnetic coupling if the conductors are insulated and do not terminate at the location selected for the identification.

Another feature of the present invention consists in the provision of a relatively simple, reliable and safe method for the identification of the phase of conductors in electrical circuits electrically interconnected together, with or without connection to the ground of all the conductors, in which the identification of the phase of the conductors is realized by direct or electromagnetic coupling of the receiver means of the different audio signals to the conductors, tested two by two.

Another feature of the present invention consists in that one of the audio signal generators generates an intermittent audio signal, and the other generator generates a continuous audio signal.

According to the above features, from a broad aspect, the present invention provides a system for the identification of the phase of conductors in an electrical circuit having an electrical interconnection, with or without the conductors connected to ground above the location selected for the identification. The system comprises two independent signal generators generating different audio signals, and respectively connected by electromagnetic coupling, to two pre-identified phase conductors of a given electrical circuit at an available location along the phase conductors situated above the location selected for the identification. A receiver means for receiving the different audio signals is connected to the phase conductors, two by two, at a location selected for the identification.

The present invention also provides a method for the identification of the phase of conductors in electrical circuits electrically interconnected together, with or without connection of the conductors to ground, at least above the location selected for the identification. The method comprises in installing two independent generators generating different audio signals, respectively, and connected by electromagnetic coupling to two pre-identified phase conductors of the given electrical circuit at an available location along the conductors above the location selected for the identification of the phases. The phase of the conductors is identified by the use of a receiver means to receive the different audio signals. The receiver is connected to the conductors, two by two, at the location selected for the identification.

BRIEF DESCRIPTION OF DRAWINGS

A preferred embodiment of the present invention will now be described with reference to the accompanying drawings in which:

FIG. 3 is a schematic illustration of the method for the identification of insulated phase conductors, and FIG. 4 is a schematic illustration of the method of identifying phase conductors, taken two by two.

DESCRIPTION OF PREFERRED EMBODIMENTS

Figure 1:
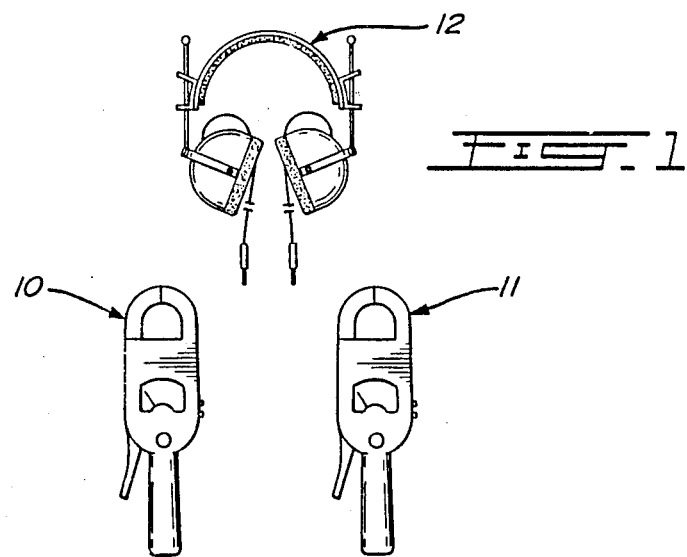
FIG. 1 is an illustration of the components of the system of the invention for identifying the phase of conductors.

Referring now to FIG. 1, there is shown the principal components of the system for the identification of the phase of conductors of an electrical circuit comprising two independent generators 10 and 11 capable of generating different audio signals (intermittent and continuous). A receiver means 12, herein a head phone, for receiving the audio signals generated by the generator 10 and 11. It is to be noted that this receiver means may also be constituted of an amplifier loudspeaker, as shown in FIG. 3.

Figure 2:
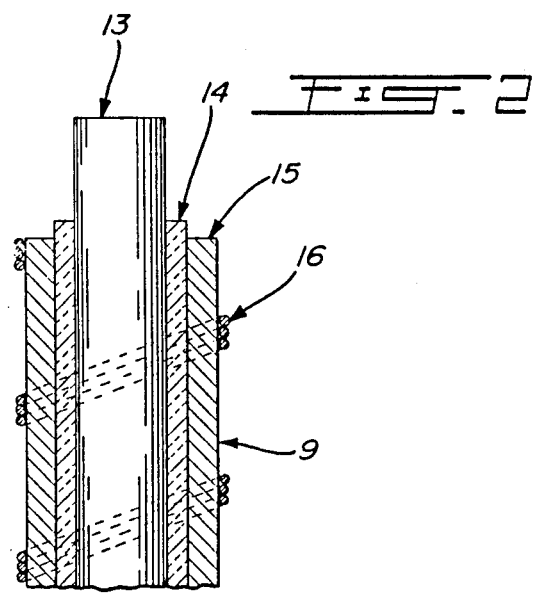
FIG. 2 is a section end view of a typical unipolar cable.

FIG. 2 shows the typical construction of a unipolar cable 9 generally constituting a phase conductor of an electrical circuit. This unipolar cable is generally composed of a conducting core 13 surrounded by a layer of synthetic insulating material 14 covered with a semiconductor sheath 15 around which tinned copper wire 16 constitute a concentric neutral. An electric circuit is generally formed of three such unipolar cables. It could also be constituted by a single triphase cable having three phase conductors therein.

Referring more particularly to FIG. 3, there will now be described a preferred embodiment of the present invention showing the application of the system for the identification of the phase of conductors in an electrical circuit. In general, FIG. 3 shows an manhole 21 between posts 8 and through which an interconnection section of an electrical circuit 20 passes. The phase conductors A, B and C are identified at the end 32 of the cables 20 located above the location selected for the identification, herein the manhole 21. At terminals 34 of the cables 20 the phase of the conductors may be identified. All the phase conductors may be connected to ground at 21 or 22, or not, at the user's preference. At an available location, along phase conductors 20, the continuous audio signal generator 11 is connected, by electromagnetic coupling, to phase conductor A and the intermittent audio signal generator 10 to the phase conductor C. At the location selected for the identification, the access pit 21, the receiver means 12 is linked by the conductors 30 and 31 connected to clamps 28 and 29 also by electromagnetic coupling or directly to any two of the phase conductors A, B and C. These receptor clamps 28 and 29 are clamped over the semi-conductor cover 15, close to the insulated interconnections 25, 26 and 27 under the concentric neutral 16. It is to be understood that the electromagnetic coupling of the receptor clamps 28 and 29 is only necessary when the phase conductors 20 are insulated, as shown in FIG. 3. In the case of bare conductors, the receiver means 12 may be directly connected to the phase conductors 20. In both cases, we then proceed to the identification of the phase of the conductors, by testing them two by two and by the use of the method shown in FIG. 4.

As shown in FIG. 4, the different audio signal generators 10 and 11 are not shown. However, since according to a well established procedure, the continuous audio signal generator 11 is always connected to phase A and the intermittent audio signal generator 12 is always connected to phase C, it is obvious that if in a first step the receiver means 12 is connected to any two conductors by means of clamps 28 and 29, a signal will be heard at the receiver. If one hears an intermittent sound, this means that the conductors 30 and 31 of receiver 12 are connected to the conductors B and C (intermittent audio signal generator), and that the conductor not connected to receiver 12 is the phase A conductor. If on the other hand, the sound is continuous, this means that the conductor not connected to receiver 12 is phase C conductor. If the two sounds are combined, this means that receiver 12 is connected to phase A and C conductors and that the conductor not connected to is the phase B conductor. This first step permits the identification of the phase of a first of the conductors. In a second step, one of the conductors 30 and 31 is connected on the previously identified conductor. Depending on the tone or signal sound received by the receiver 12, we will now be able to indentify the phase conductor which is not connected during the second step. The identification of the third phase connector is therefore possible by the process of elimination, and this identification is confirmed in a third step in the method by connecting conductors 30 and 31 of the receiver 12 to the two pre-identified phase conductors.

The present invention therefore provides a system and a method for the identification of the phase of conductors in an electrical circuit, whether or not the conductors are connected to ground, and which is safe, reliable, flexible, simple in its installation and operation, compact, and inexpensive.

The embodiments of the present invention will be particularly useful to workers involved in the junction of underground distribution cables permitting them to work in security without removing any ground connection, if existent, while performing their work.

It is within the ambit of the preferred embodiment described herein, provided such modifications fall within the scope of the appended claims.

I claim:

1. A system for the identification of the phase of three insulated electrical conductors in an electrical circuit having the conductors interconnected together, said conductors having an insulating covering over a conductive core and being connected to ground or not at least above the location selected for the identification, said system comprising two independent signal generators for generating different audio signals and having connectors coupled by electromagnetic coupling to two of said conductors having a pre-identified phase and at an available location above the location selected for the identification of phase, said coupling being effected without physical contact of said conductive core, and magnetically coupled receiver means for receiving said different audio signals and having two clamp means connectable to any two conductors at said location selected for the identification and producing received sounds to identify the phase of the conductors.

2. A system as claimed in claim 1, in which the electrical circuit is constituted of a triphase cable.

3. A system as claimed in claim 1, in which the electrical circuit is constituted of three separate unipolar conductor cables.

4. A system as claimed in claim 1, in which one of the audio signals is intermittent and the other is continuous.

5. A system as claimed in claim 1, in which said two independent generators operate on rechargeable batteries.

6. A system as claimed in claim 1, in which said two independent generators are housed in respective housings shaped as amperemeter clamps.

7. A system as claimed in claim 1, in which said receiver means is a pair of earphones.

8. A system as claimed in claim 1, in which said receiver means is a loudspeaker.

9. A system as claimed in claim 1, in which the conductors at said location selected for the identification are bare conductors.

10. A system as claimed in claim 1, in which the conductors at said location selected for the identification are insulated conductors.

11. A system as claimed in claim 1 or 9, in which said receiver means is connected by direct electrical connection to conductors at said location selected for the identification.

12. A system as claimed in claims 1 or 10, in which said receiver means is electromagnetically coupled to conductors at said location selected for the identification by electromagnetic coupling using receptor clamps.

13. A system as claimed in claim 1, in which said location selected for the identification is located in a manhole where said conductors have insulated and jointed connection.

14. A system as claimed in claim 1, in which said location selected for the identification is located at terminals of said conductors of said electrical circuit.

15. A method of identifying the phase of three insulated electrical conductors in an electrical circuit having conductors interconnected together, with or without a ground connection at least above the location selected for the identification, said method comprising electromagnetically coupling, without physical contact of said conductors, two independent generators having different audio signals respectively to two conductors of said electrical circuit, said conductors having an insulating covering over a conductive core and further having pre-identified phases, and at an available location along said conductors above said location selected for the identification of phase, and identifying the phase of said conductors by means of magnetically connecting two receivers capable of receiving said different audio signals to two of said phase conductors at said location selected for the identification.

16. A method as claimed in claim 15, in which said electrical circuit is constituted by a triphase cable.

17. A method as claimed in claim 15, in which said electrical circuit is constituted of three unipolar cables.

18. A method as claimed in claim 15, in which one of the audio signals is intermittent and the other is continuous.

19. A method as claimed in claim 15, in which the two independent generators are operated on rechargeable batteries.

20. A method as claimed in claim 15, in which the two independent generators are constructed as amperemeter clamps.

21. A method as claimed in claim 15, in which said receiver means is a pair of earphones.

22. A method as claimed in claim 15, in which said receiver means is an amplifier loudspeaker.

23. A method as claimed in claim 15, in which said conductors, at said location selected for the identification, are bare conductors.

24. A method as claimed in claim 15, in which said connectors, at said location selected for the identification, are insulated conductors.

25. A method as claimed in claims 15 or 23, in which said receiver means is connected by direct electrical connection to conductors at said location selected for the identification.

26. A method as claimed in claims 15 or 24, in which said receiver means is connected to conductors, at said location selected for the identification, by electromagnetic coupling using receptor clamps.

27. A method as claimed in claim 15, in which said location selected for the identification is located in a manhole, close to an insulated junction of the conductors of said electrical circuit.

28. A method as claimed in claim 15, in which said location selected for the identification is located at the terminals of said conductors of said electrical circuit.

29. A method as claimed in claim 27, in which ground connections for every conductor of said electrical circuit are made at each end of said circuit and in which said receiver means is connected to any two of said conductors at said location selected for the identification, said receiver connection being effected by electromagnetic coupling using receptor clamps, secured on said two conductors of said given electrical circuit close to said insulated junction over a semiconductive insulated sheath of said two conductors.

* * * * *